(12) United States Patent
Omori et al.

(10) Patent No.: US 11,551,946 B2
(45) Date of Patent: Jan. 10, 2023

(54) LIGHT IRRADIATION TYPE HEAT TREATMENT METHOD AND HEAT TREATMENT APPARATUS

(71) Applicant: SCREEN Holdings Co., Ltd., Kyoto (JP)

(72) Inventors: Mao Omori, Kyoto (JP); Yoshihide Nozaki, Kyoto (JP); Yoshio Ito, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 131 days.

(21) Appl. No.: 16/894,997

(22) Filed: Jun. 8, 2020

(65) Prior Publication Data

US 2021/0020472 A1 Jan. 21, 2021

(30) Foreign Application Priority Data

Jul. 17, 2019 (JP) .............................. JP2019-131607

(51) Int. Cl.
*H01L 21/324* (2006.01)
*H01L 21/66* (2006.01)
*H01L 21/67* (2006.01)

(52) U.S. Cl.
CPC .. *H01L 21/67115* (2013.01); *H01L 21/67248* (2013.01); *H01L 22/12* (2013.01); *H01L 21/324* (2013.01); *H01L 21/67288* (2013.01)

(58) Field of Classification Search
CPC ......... H01L 21/67115; H01L 21/67248; H01L 21/324; H01L 21/67288; H01L 22/12; G01J 5/0007
See application file for complete search history.

(56) References Cited

U.S. PATENT DOCUMENTS 9,343,313 B2 * 5/2016 Fuse ................. H01L 21/67248
9,351,341 B2 * 5/2016 Nishide .................... H05B 1/00
(Continued)

FOREIGN PATENT DOCUMENTS

JP 2005-340591 A 12/2005
JP 2006-165516 A 6/2006
(Continued)

OTHER PUBLICATIONS

Notification of Reason for Refusal dated Nov. 17, 2021 in corresponding Korean Patent Application No. 10-2020-0087507 with computer-generated English translation obtained from the JPO.
(Continued)

*Primary Examiner* — Mary A Wilczewski
(74) *Attorney, Agent, or Firm* — Ostrolenk Faber LLP

(57) ABSTRACT

A semiconductor wafer is preheated with a halogen lamp, and then is heated by irradiation with a flash of light emitted from a flash lamp. The preheating with the halogen lamp is continued for a short time even after the flash lamp turns off. A radiation thermometer measures a front surface temperature and a back surface temperature of the semiconductor wafer. A temperature integrated value is calculated by integration of temperatures of the semiconductor wafer measured during a period from a start of the flash irradiation to an end of the heating of the semiconductor wafer. It is determined that the semiconductor wafer is cracked at the time of flash irradiation when the calculated temperature integrated value deviates from a preset range between an upper limit value and a lower limit value.

6 Claims, 9 Drawing Sheets

(56) References Cited

U.S. PATENT DOCUMENTS

| | | | |
|---|---|---|---|
| 9,437,456 B2* | 9/2016 | Yokouchi | F27B 17/0025 |
| 9,449,825 B2* | 9/2016 | Yokouchi | F27D 11/12 |
| 9,633,868 B2* | 4/2017 | Yokouchi | H01L 21/6875 |
| 2008/0190909 A1* | 8/2008 | Yokouchi | H01L 21/67115 219/385 |
| 2009/0076763 A1 | 3/2009 | Okamura et al. | |
| 2013/0203269 A1* | 8/2013 | Yokouchi | H01L 21/26 392/416 |
| 2013/0206747 A1* | 8/2013 | Nishide | H05B 1/00 219/538 |
| 2014/0161429 A1* | 6/2014 | Yokouchi | H01L 21/67115 392/416 |
| 2014/0162467 A1* | 6/2014 | Yokouchi | F27B 5/18 438/799 |
| 2014/0169772 A1* | 6/2014 | Abe | H05B 3/0047 392/418 |
| 2014/0235072 A1* | 8/2014 | Ito | H01L 21/6875 392/416 |
| 2016/0093539 A1* | 3/2016 | Nakanishi | G01J 1/42 250/341.4 |
| 2016/0293424 A1* | 10/2016 | Fuse | H01L 21/02694 |
| 2016/0318077 A1* | 11/2016 | Nishihara | G01N 15/00 |
| 2016/0343584 A1* | 11/2016 | Yokouchi | H01L 21/68792 |
| 2017/0053818 A1 | 2/2017 | Aoyama | |
| 2017/0140976 A1* | 5/2017 | Abe | H01L 21/68735 |
| 2017/0194177 A1 | 7/2017 | Cibere | |
| 2018/0254224 A1* | 9/2018 | Kitazawa | H01L 21/6875 |
| 2019/0035645 A1* | 1/2019 | Nakajima | H01L 21/67288 |
| 2019/0067051 A1* | 2/2019 | Omori | H01L 21/67115 |
| 2019/0084014 A1* | 3/2019 | Furukawa | B08B 5/00 |
| 2019/0157168 A1* | 5/2019 | Kawarazaki | H01L 21/67115 |
| 2019/0267261 A1 | 8/2019 | Akiyoshi et al. | |
| 2019/0371632 A1 | 12/2019 | Aoyama | |
| 2020/0098600 A1* | 3/2020 | Ueno | H01L 21/6875 |
| 2020/0098601 A1* | 3/2020 | Ueno | H01L 21/68707 |
| 2020/0126807 A1* | 4/2020 | Ikeda | H01L 22/20 |
| 2021/0020472 A1* | 1/2021 | Omori | H01L 22/12 |
| 2021/0327771 A1* | 10/2021 | Kitazawa | H01L 22/12 |
| 2021/0366745 A1* | 11/2021 | Furukawa | F27D 5/0037 |

FOREIGN PATENT DOCUMENTS

| | | |
|---|---|---|
| JP | 2009-231697 A | 10/2009 |
| JP | 2015-130423 A | 7/2015 |
| JP | 2017-041468 A | 2/2017 |
| JP | 2018-148201 A | 9/2018 |
| JP | 2019-149526 A | 9/2019 |
| KR | 10-2018-010225 A | 9/2018 |

OTHER PUBLICATIONS

Notification of Reason for Refusal dated Apr. 27, 2022 in corresponding Korean Patent Application No. 10-2020-0087507 and a computer-generated English translation obtained from the JPO.

* cited by examiner

F I G. 7
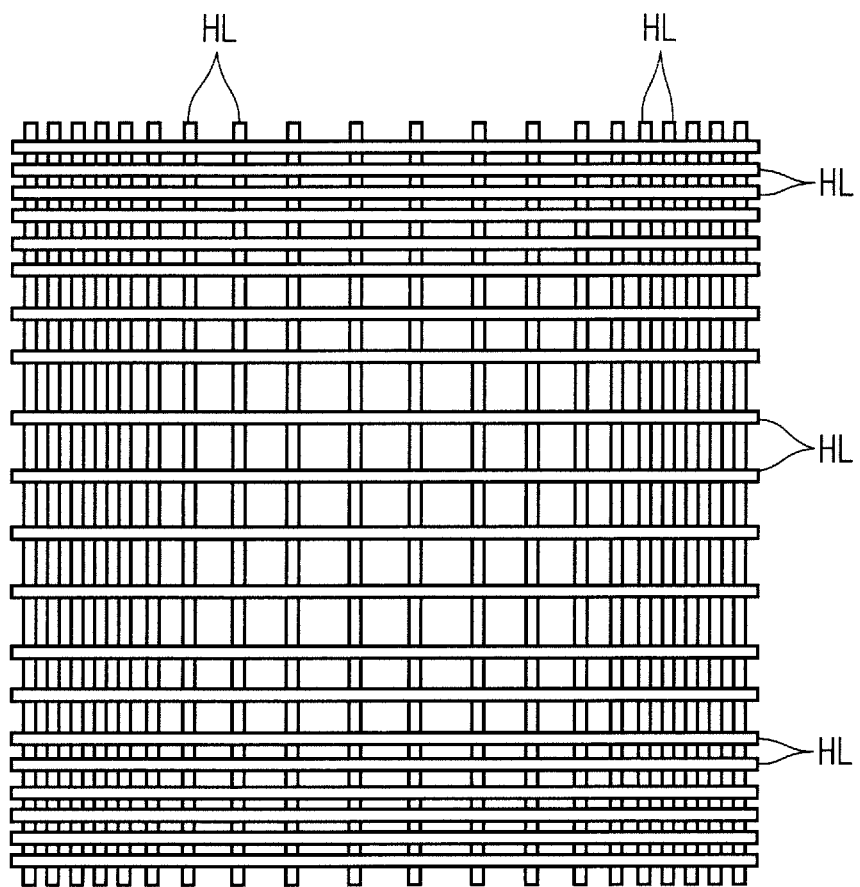

F I G. 8
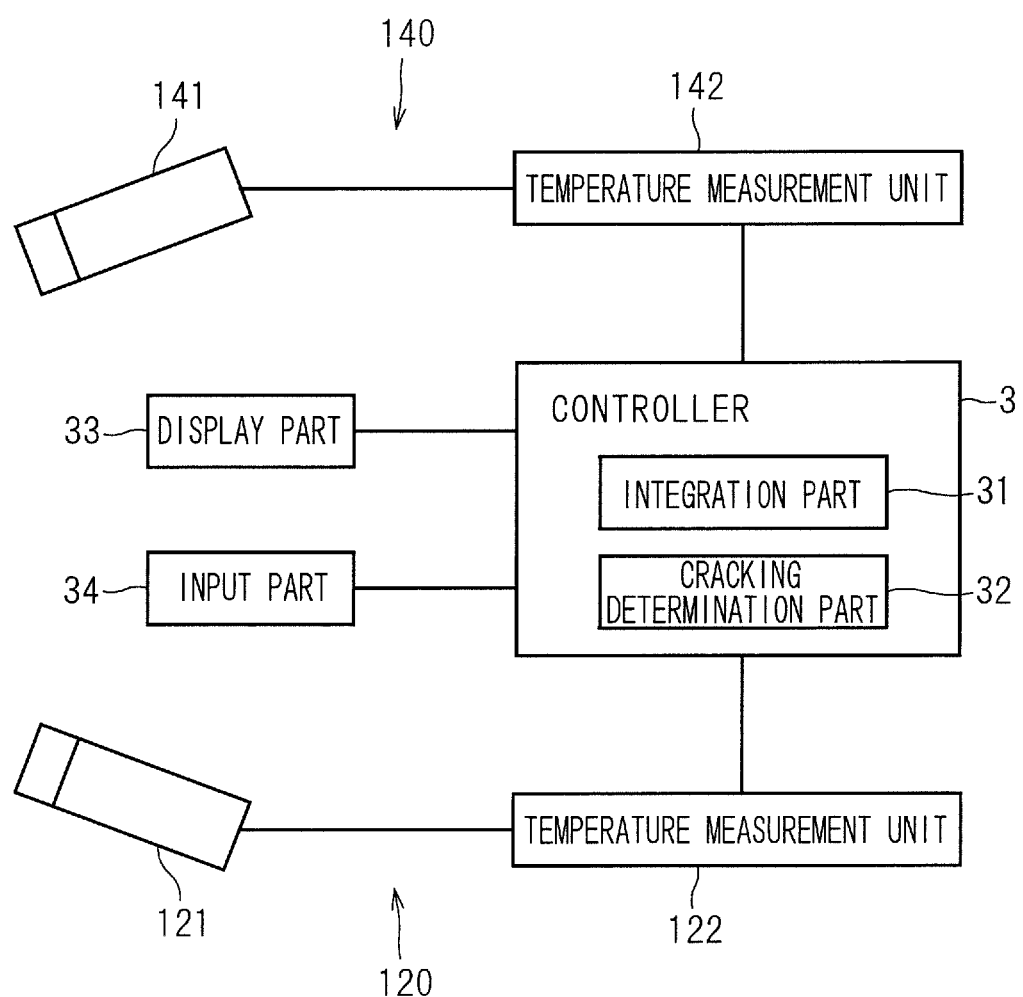

F I G. 9
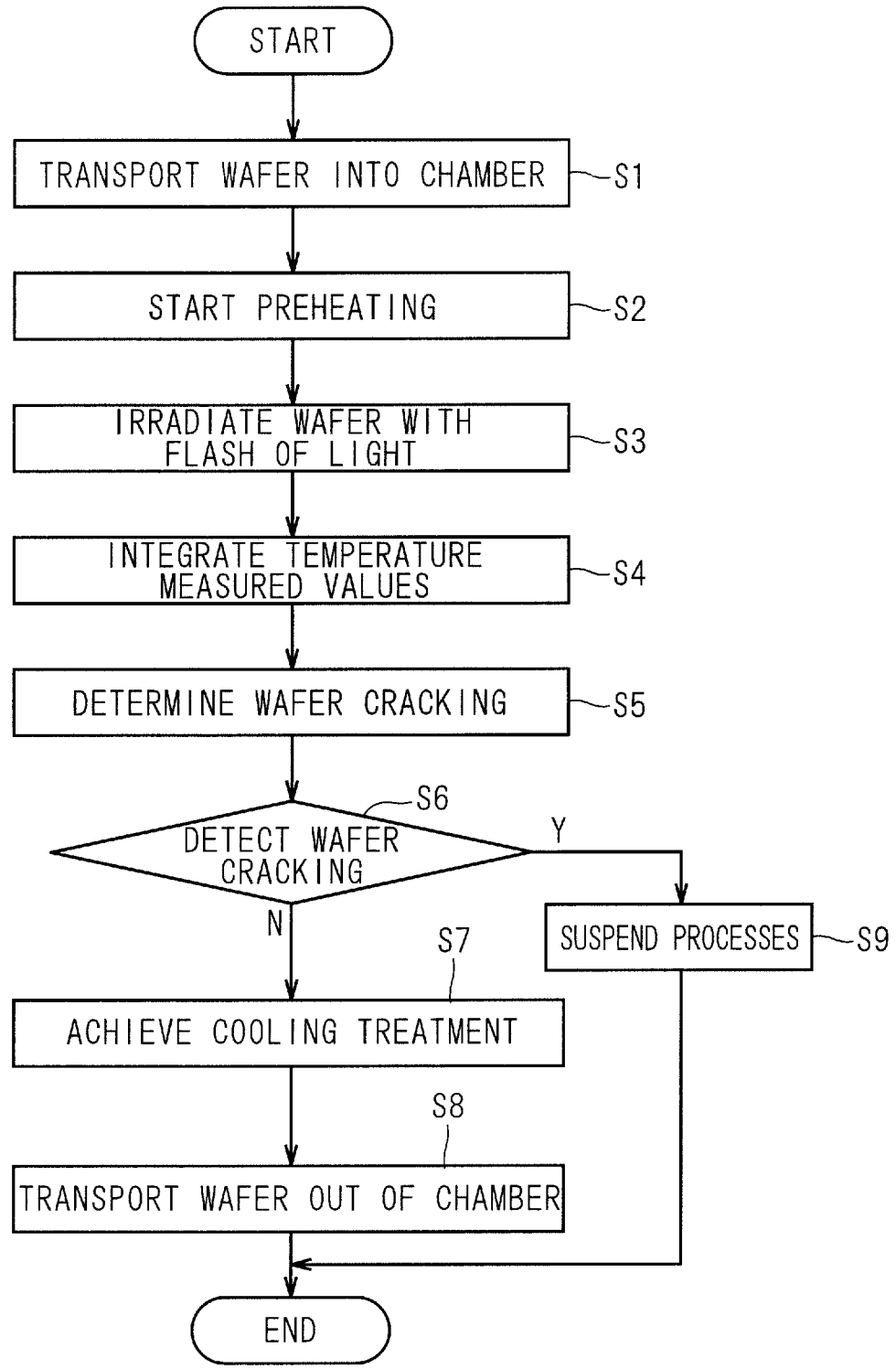

LIGHT IRRADIATION TYPE HEAT TREATMENT METHOD AND HEAT TREATMENT APPARATUS

BACKGROUND OF THE INVENTION

Field of the Invention

The present invention relates to a heat treatment method and a heat treatment apparatus which irradiate a thin plate-like precision electronic substrate (hereinafter referred to simply as a "substrate") such as a semiconductor wafer with a flash of light to heat the substrate.

Description of the Background Art

In the process of manufacturing a semiconductor device, impurity doping is an essential step for forming a pn junction in a semiconductor wafer. At present, it is common practice to perform impurity doping by an ion implantation process and a subsequent annealing process. The ion implantation process is a technique for causing ions of impurity elements such as boron (B), arsenic (As) and phosphorus (P) to collide against the semiconductor wafer with high acceleration voltage, thereby physically implanting the impurities into the semiconductor wafer. The implanted impurities are activated by the subsequent annealing process. When annealing time in this annealing process is approximately several seconds or longer, the implanted impurities are deeply diffused by heat. This results in a junction depth much greater than a required depth, which might constitute a hindrance to good device formation.

In recent years, attention has been given to flash lamp annealing (FLA) that is an annealing technique for heating a semiconductor wafer in an extremely short time. The flash lamp annealing is a heat treatment technique in which xenon flash lamps (the term "flash lamp" as used hereinafter refers to a "xenon flash lamp") are used to irradiate a surface of a semiconductor wafer with a flash of light, thereby raising the temperature of only the surface of the semiconductor wafer implanted with impurities in an extremely short time (several milliseconds or less).

The xenon flash lamps have a spectral distribution of radiation ranging from ultraviolet to near-infrared regions. The wavelength of light emitted from the xenon flash lamps is shorter than that of light emitted from conventional halogen lamps, and approximately coincides with a fundamental absorption band of a silicon semiconductor wafer. Thus, when a semiconductor wafer is irradiated with a flash of light emitted from the xenon flash lamps, the temperature of the semiconductor wafer can be raised rapidly, with only a small amount of light transmitted through the semiconductor wafer. Also, it has turned out that flash irradiation, that is, the irradiation of a semiconductor wafer with a flash of light in an extremely short time of several milliseconds or less allows a selective temperature rise only near the surface of the semiconductor wafer. Therefore, the temperature rise in an extremely short time with the xenon flash lamps allows only the activation of impurities to be achieved without deep diffusion of the impurities.

In a heat treatment apparatus including such flash lamps, the flash lamps instantaneously irradiate a surface of a semiconductor wafer with a flash of light having extremely high energy. Therefore, the heat treatment apparatus momentarily causes a rapid temperature rise at a front surface of the semiconductor wafer, but does not cause a temperature rise at a back surface of the semiconductor wafer so much. For this reason, only the front surface of the semiconductor wafer undergoes rapid thermal expansion. As a result, the semiconductor wafer becomes deformed with its upper surface bowed outward. At the next moment, the semiconductor wafer becomes deformed with its lower surface bowed outward as a reaction.

When the semiconductor wafer becomes deformed with its upper surface bowed outward, the semiconductor wafer collides at its edge portion against a susceptor. On the other hand, when the semiconductor wafer becomes deformed with its lower surface bowed outward, the semiconductor wafer collides at its center portion against the susceptor. This results in cracking of the semiconductor wafer due to an impact caused by the collision against the susceptor.

When the cracked semiconductor wafer is subjected to a cooling treatment using the large rate of flow of gas, particles increase and diffuse, which might contaminate another semiconductor wafer. Also when a chamber is decompressed by a vacuum pump for atmosphere replacement in the state in which the semiconductor wafer is cracked, particles derived from the fragments are carried into the vacuum pump, which might cause a vacuum pump malfunction.

To prevent this, if the wafer cracking occurs at the time of flash heating, it is necessary to promptly detect the cracked semiconductor wafer, to stop the transport of a subsequent semiconductor wafer into the chamber, and to clean up the interior of the chamber. From the viewpoint of securely preventing diffusion of particles and damages to accessories such as a vacuum pump, it is particularly required to detect cracking of a semiconductor wafer in a chamber before gas supply and exhaust for decompression subsequent to flash heating.

For example, Japanese Patent Application Laid-Open No. 2009-231697 discloses a technique for determining wafer cracking by sensing sound generated when a semiconductor wafer is cracked, using a microphone disposed in a chamber where the semiconductor wafer is subjected to a flash heating treatment. In addition, Japanese Patent Application Laid-Open No. 2015-130423 discloses a technique for detecting wafer cracking from the intensity of light reflected from a semiconductor wafer and received by a light guide rod.

However, the technique disclosed in Japanese Patent Application Laid-Open No. 2009-231697 has difficulty in performing filtering for extracting only sound generated when a semiconductor wafer is cracked. The technique disclosed in Japanese Patent Application Laid-Open No. 2015-130423 requires a step of rotating the light guide rod before and after flash irradiation, resulting in throughput reduction.

SUMMARY OF THE INVENTION

The present invention is intended for a heat treatment method for heating a substrate by irradiating the substrate with a flash of light.

According to one aspect of the present invention, a heat treatment method includes the steps of: (a) receiving a substrate in a chamber; (b) irradiating the substrate with light emitted from a continuous lighting lamp to heat the substrate to a preheating temperature; (c) irradiating a front surface of the substrate with a flash of light emitted from a flash lamp to heat the front surface; (d) measuring temperatures of the substrate during a period from a start of the flash irradiation to an end of the heating of the substrate; (e) integrating the temperatures of the substrate measured in the step (d) to calculate a temperature integrated value; and (f) determining that the substrate is cracked when the temperature integrated value deviates from a preset range between an upper limit value and a lower limit value.

It is possible to promptly detect cracking of a substrate at the time of flash irradiation with a simple configuration.

Preferably, when it is determined in the step (f) that the substrate is cracked, supply and exhaust of gas into and out of the chamber are stopped.

It is possible to prevent a secondary problem of diffusion of particles generated when a substrate is cracked.

The present invention is also intended for a heat treatment apparatus for heating a substrate by irradiating the substrate with a flash of light.

According to one aspect of the present invention, a heat treatment apparatus includes: a chamber for receiving a substrate therein; a susceptor for holding the substrate in the chamber; a continuous lighting lamp for irradiating the substrate held by the susceptor with light to heat the substrate to a preheating temperature; a flash lamp for irradiating a front surface of the substrate with a flash of light to heat the front surface; a radiation thermometer for measuring a temperature of the substrate; a calculation part for integrating temperatures of the substrate measured by the radiation thermometer during a period from a start of the flash irradiation to an end of the heating of the substrate to calculate a temperature integrated value; and a determination part for determining that the substrate is cracked when the temperature integrated value deviates from a preset range between an upper limit value and a lower limit value.

It is possible to promptly detect cracking of a substrate at the time of flash irradiation with a simple configuration.

Preferably, when the determination part determines that the substrate is cracked, supply and exhaust of gas into and out of the chamber are stopped.

It is possible to prevent a secondary problem of diffusion of particles generated when a substrate is cracked.

It is therefore an object of the present invention is to promptly detect cracking of a substrate at the time of flash irradiation with a simple configuration.

These and other objects, features, aspects and advantages of the present invention will become more apparent from the following detailed description of the present invention when taken in conjunction with the accompanying drawings.

BRIEF DESCRIPTION OF THE DRAWINGS

FIG. 7 is a plan view showing an arrangement of halogen lamps;

FIG. 8 is a functional block diagram of a radiation thermometer and a controller;

FIG. 9 is a flowchart showing a procedure for a treatment of a semiconductor wafer.

DESCRIPTION OF THE PREFERRED EMBODIMENTS

Preferred embodiments according to the present invention will now be described in detail with reference to the drawings.

First Preferred Embodiment

Figure 1:
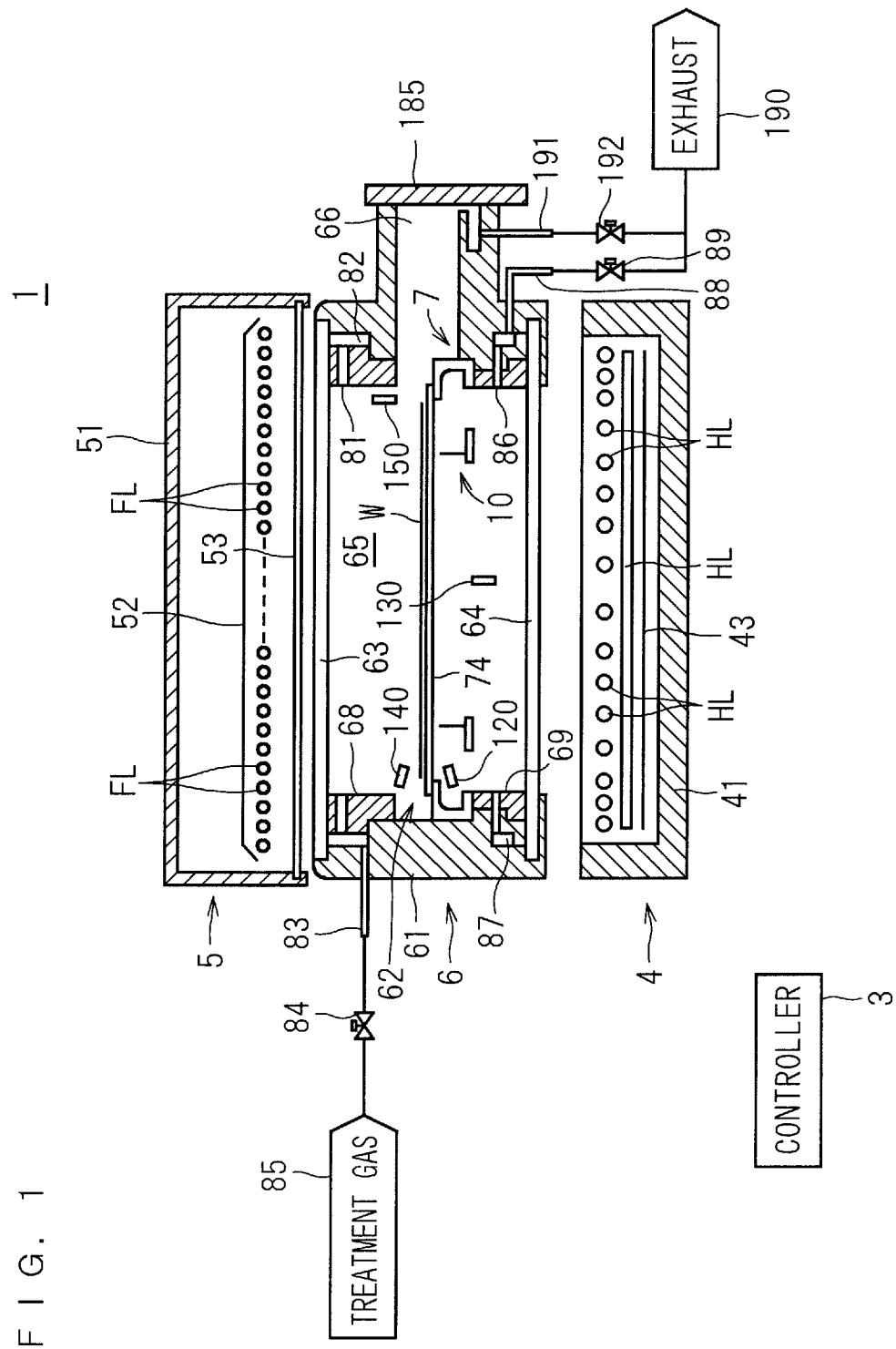
FIG. 1 is a longitudinal sectional view showing a configuration of a heat treatment apparatus according to the present invention.

FIG. 1 is a longitudinal sectional view showing a configuration of a heat treatment apparatus 1 according to the present invention. The heat treatment apparatus 1 in FIG. 1 is a flash lamp annealer for irradiating a disk-shaped semiconductor wafer W serving as a substrate with flashes of light to heat the semiconductor wafer W. The size of the semiconductor wafer W to be treated is not particularly limited. For example, the semiconductor wafer W to be treated has a diameter of 300 mm and 450 mm (in the present preferred embodiment, 300 mm). The semiconductor wafer W prior to the transport into the heat treatment apparatus 1 is implanted with impurities. The heat treatment apparatus 1 performs a heating treatment on the semiconductor wafer W to thereby activate the impurities implanted in the semiconductor wafer W. It should be noted that the dimensions of components and the number of components are shown in exaggeration or in simplified form, as appropriate, in FIG. 1 and the subsequent figures for the sake of easier understanding.

The heat treatment apparatus 1 includes a chamber 6 for receiving a semiconductor wafer W therein, a flash heating part 5 including a plurality of built-in flash lamps FL, and a halogen heating part 4 including a plurality of built-in halogen lamps HL. The flash heating part 5 is provided over the chamber 6, and the halogen heating part 4 is provided under the chamber 6. The heat treatment apparatus 1 further includes a holder 7 provided inside the chamber 6 and for holding a semiconductor wafer W in a horizontal attitude, and a transfer mechanism 10 provided inside the chamber 6 and for transferring a semiconductor wafer W between the holder 7 and the outside of the heat treatment apparatus 1. The heat treatment apparatus 1 further includes a controller 3 for controlling operating mechanisms provided in the halogen heating part 4, the flash heating part 5 and the chamber 6 to cause the operating mechanisms to heat-treat a semiconductor wafer W.

The chamber 6 is configured such that upper and lower chamber windows 63 and 64 made of quartz are mounted to the top and bottom, respectively, of a tubular chamber side portion 61. The chamber side portion 61 has a generally tubular shape having an open top and an open bottom. The upper chamber window 63 is mounted to block the top opening of the chamber side portion 61, and the lower chamber window 64 is mounted to block the bottom opening thereof. The upper chamber window 63 forming the ceiling of the chamber 6 is a disk-shaped member made of quartz, and serves as a quartz window that transmits flashes of light emitted from the flash heating part 5 therethrough into the chamber 6. The lower chamber window 64 forming the floor of the chamber 6 is also a disk-shaped member made of quartz, and serves as a quartz window that transmits light emitted from the halogen heating part 4 therethrough into the chamber 6.

An upper reflective ring 68 is mounted to an upper portion of the inner wall surface of the chamber side portion 61, and a lower reflective ring 69 is mounted to a lower portion thereof. Both of the upper and lower reflective rings 68 and 69 are in the form of an annular ring. The upper reflective ring 68 is mounted by being inserted downwardly from the top of the chamber side portion 61. The lower reflective ring 69, on the other hand, is mounted by being inserted upwardly from the bottom of the chamber side portion 61 and fastened with screws not shown. In other words, the upper and lower reflective rings 68 and 69 are removably mounted to the chamber side portion 61. An interior space of the chamber 6, i.e. a space surrounded by the upper chamber window 63, the lower chamber window 64, the chamber side portion 61, and the upper and lower reflective rings 68 and 69, is defined as a heat treatment space 65.

A recessed portion 62 is defined in the inner wall surface of the chamber 6 by mounting the upper and lower reflective rings 68 and 69 to the chamber side portion 61. Specifically, the recessed portion 62 is defined which is surrounded by a middle portion of the inner wall surface of the chamber side portion 61 where the reflective rings 68 and 69 are not mounted, a lower end surface of the upper reflective ring 68, and an upper end surface of the lower reflective ring 69. The recessed portion 62 is provided in the form of a horizontal annular ring in the inner wall surface of the chamber 6, and surrounds the holder 7 which holds a semiconductor wafer W. The chamber side portion 61 and the upper and lower reflective rings 68 and 69 are made of a metal material (e.g., stainless steel) with high strength and high heat resistance.

The chamber side portion 61 is provided with a transport opening (throat) 66 for the transport of a semiconductor wafer W therethrough into and out of the chamber 6. The transport opening 66 is openable and closable by a gate valve 185. The transport opening 66 is connected in communication with an outer peripheral surface of the recessed portion 62. Thus, when the transport opening 66 is opened by the gate valve 185, a semiconductor wafer W is allowed to be transported through the transport opening 66 and the recessed portion 62 into and out of the heat treatment space 65. When the transport opening 66 is closed by the gate valve 185, the heat treatment space 65 in the chamber 6 is an enclosed space.

At least one gas supply opening 81 for supplying a treatment gas therethrough into the heat treatment space 65 is provided in an upper portion of the inner wall of the chamber 6. The gas supply opening 81 is provided above the recessed portion 62, and may be provided in the upper reflective ring 68. The gas supply opening 81 is connected in communication with a gas supply pipe 83 through a buffer space 82 provided in the form of an annular ring inside the side wall of the chamber 6. The gas supply pipe 83 is connected to a treatment gas supply source 85. A valve 84 is inserted at some midpoint in the gas supply pipe 83. When the valve 84 is opened, the treatment gas is fed from the treatment gas supply source 85 to the buffer space 82. The treatment gas flowing in the buffer space 82 flows in a spreading manner within the buffer space 82 which is lower in fluid resistance than the gas supply opening 81, and is supplied through the gas supply opening 81 into the heat treatment space 65. Examples of the treatment gas usable herein include inert gases such as nitrogen gas ($N_2$), reactive gases such as hydrogen ($H_2$) and ammonia ($NH_3$), or mixtures of these gases (although nitrogen gas is used in the present preferred embodiment). Alternatively, cooling gases such as helium (He) and argon (Ar) can also be supplied as the treatment gas through the gas supply opening 81 into the chamber 6.

At least one gas exhaust opening 86 for exhausting a gas from the heat treatment space 65 is provided in a lower portion of the inner wall of the chamber 6. The gas exhaust opening 86 is provided below the recessed portion 62, and may be provided in the lower reflective ring 69. The gas exhaust opening 86 is connected in communication with a gas exhaust pipe 88 through a buffer space 87 provided in the form of an annular ring inside the side wall of the chamber 6. The gas exhaust pipe 88 is connected to an exhaust part 190. A valve 89 is inserted at some midpoint in the gas exhaust pipe 88. When the valve 89 is opened, the gas in the heat treatment space 65 is exhausted through the gas exhaust opening 86 and the buffer space 87 to the gas exhaust pipe 88. The at least one gas supply opening 81 and the at least one gas exhaust opening 86 may include a plurality of gas supply openings 81 and a plurality of gas exhaust openings 86, respectively, arranged in a circumferential direction of the chamber 6, and may be in the form of slits.

The exhaust part 190 includes a vacuum pump. The exhaust part 190 is operated to exhaust the gas from the heat treatment space 65 without supply of the treatment gas through the gas supply opening 81, whereby the interior of the chamber 6 can be decompressed to a pressure less than atmospheric pressure. In addition, the vacuum pump of the exhaust part 190 is connected to the gas exhaust pipe 88 with, for example, three bypass lines different in diameter from one another. The exhaust rate and exhaust velocity of the exhaust part 190 exhausting the gas from the chamber 6 can be changed depending on which one of the three bypass lines is opened.

A gas exhaust pipe 191 for exhausting the gas from the heat treatment space 65 is also connected to a distal end of the transport opening 66. The gas exhaust pipe 191 is connected through a valve 192 to the exhaust part 190. By opening the valve 192, the gas in the chamber 6 is exhausted through the transport opening 66.

Figure 2:
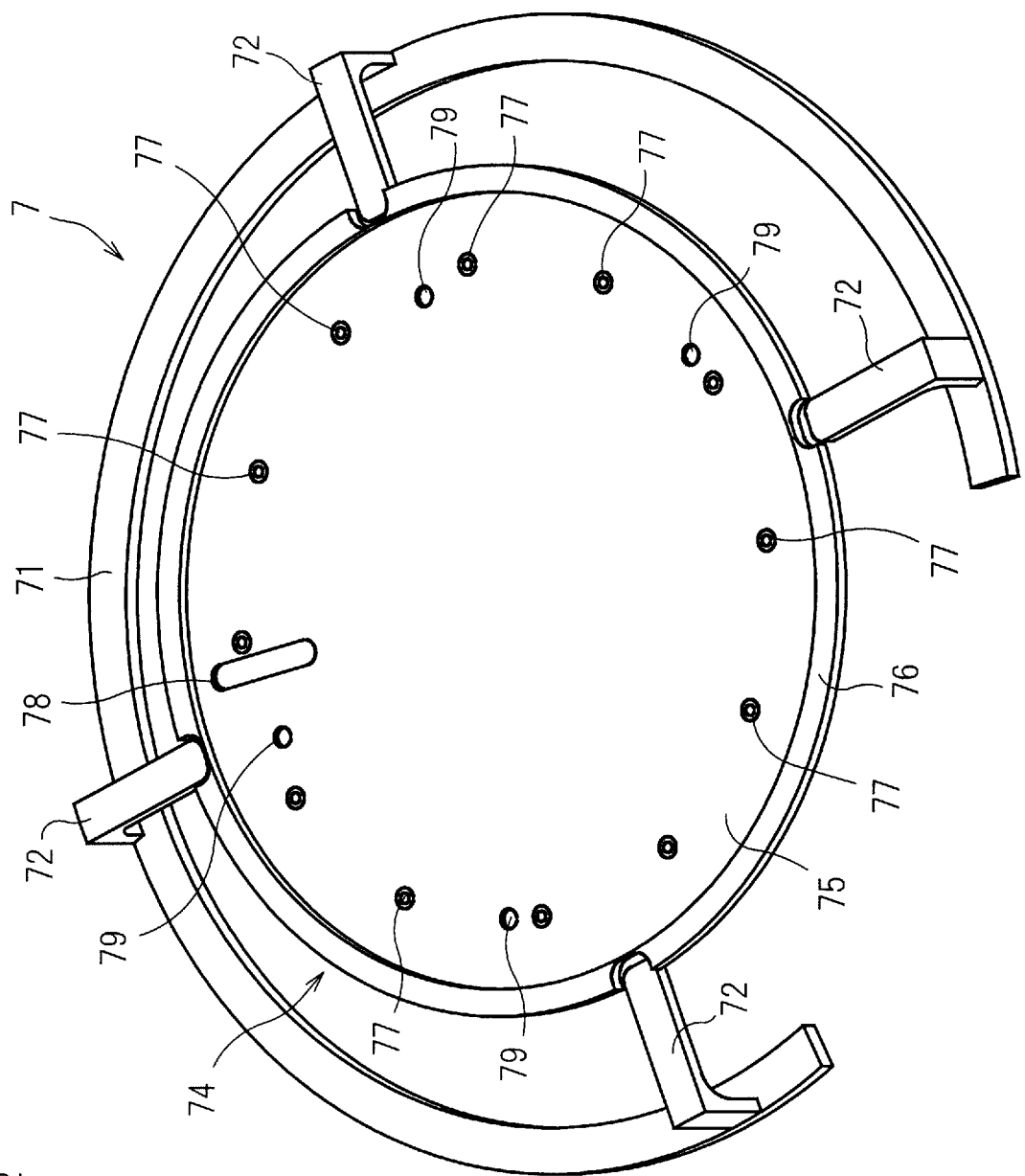
FIG. 2 is a perspective view showing the entire external appearance of a holder.

FIG. 2 is a perspective view showing the entire external appearance of the holder 7. The holder 7 includes a base ring 71, coupling portions 72, and a susceptor 74. The base ring 71, the coupling portions 72, and the susceptor 74 are all made of quartz. In other words, the whole of the holder 7 is made of quartz.

The base ring 71 is a quartz member having an arcuate shape obtained by removing a portion from an annular shape. This removed portion is provided to prevent interference between transfer arms 11 of the transfer mechanism 10 to be described later and the base ring 71. The base ring 71 is supported by the wall surface of the chamber 6 by being placed on the bottom surface of the recessed portion 62 (with reference to FIG. 1). The multiple coupling portions 72 (in the present preferred embodiment, four coupling portions 72) are mounted upright on the upper surface of the base ring 71 and arranged in a circumferential direction of the annular shape thereof. The coupling portions 72 are quartz members, and are rigidly secured to the base ring 71 by welding.

Figure 3:
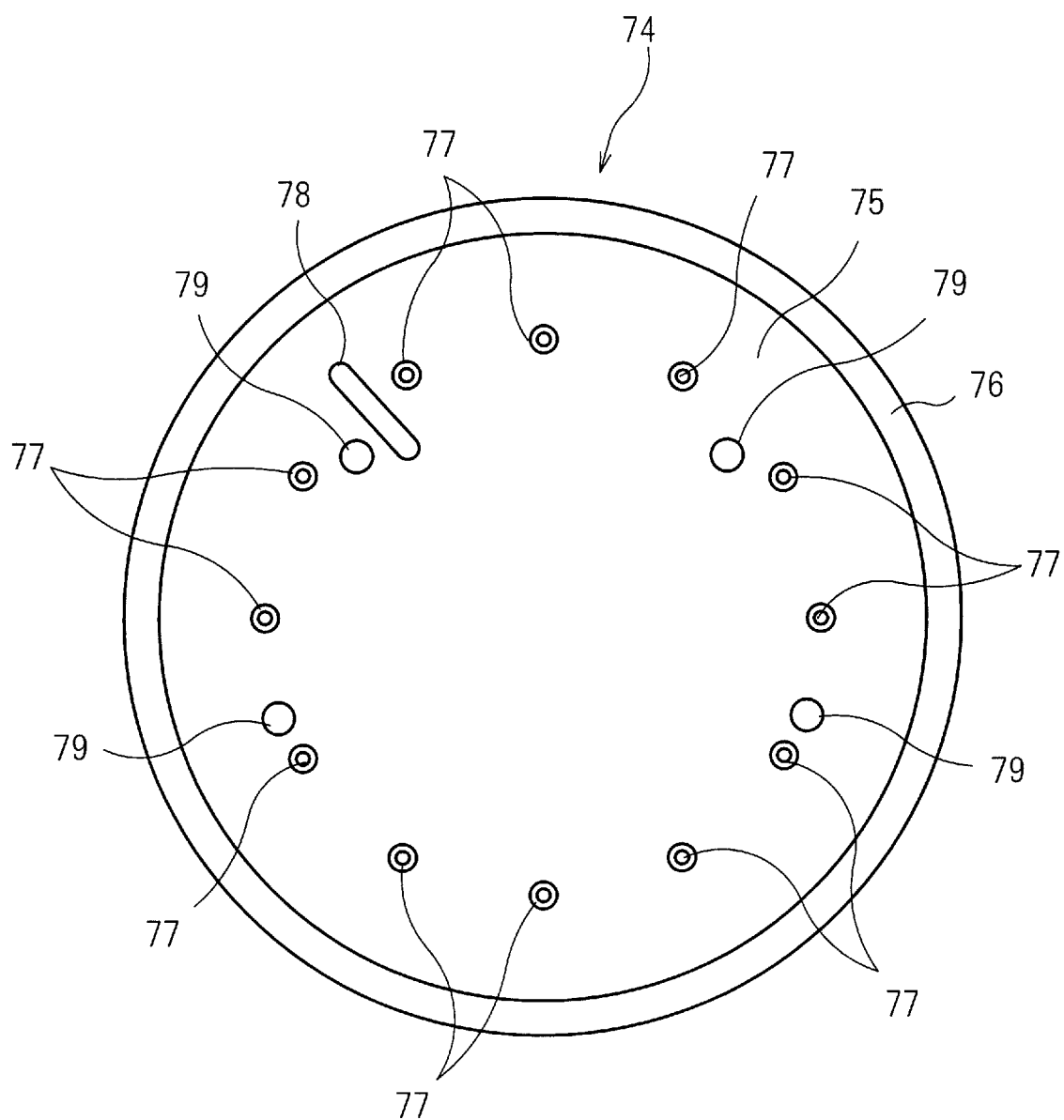
FIG. 3 is a plan view of a susceptor.
Figure 4:
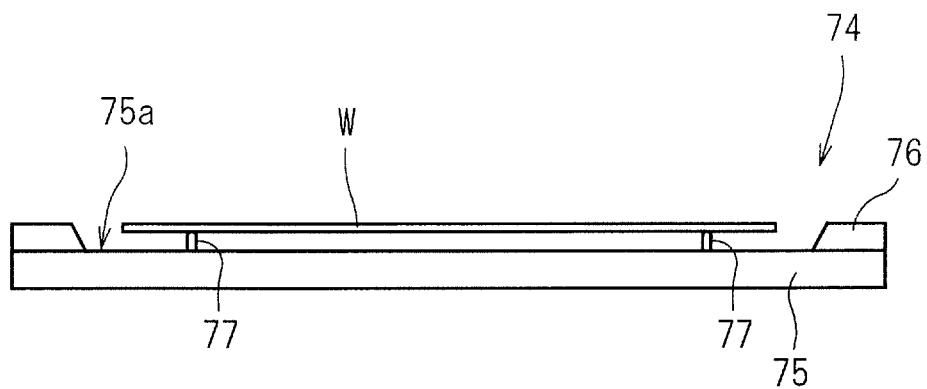
FIG. 4 is a sectional view of the susceptor.

The susceptor 74 is supported by the four coupling portions 72 provided on the base ring 71. FIG. 3 is a plan view of the susceptor 74. FIG. 4 is a sectional view of the susceptor 74. The susceptor 74 includes a holding plate 75, a guide ring 76, and a plurality of substrate support pins 77. The holding plate 75 is a generally circular planar member made of quartz. The diameter of the holding plate 75 is greater than that of a semiconductor wafer W. In other words, the holding plate 75 has a size, as seen in plan view, greater than that of the semiconductor wafer W.

The guide ring 76 is provided on a peripheral portion of the upper surface of the holding plate 75. The guide ring 76 is an annular member having an inner diameter greater than the diameter of the semiconductor wafer W. For example, when the diameter of the semiconductor wafer W is 300 mm, the inner diameter of the guide ring 76 is 320 mm. The inner periphery of the guide ring 76 is in the form of a tapered surface which becomes wider in an upward direction from the holding plate 75. The guide ring 76 is made of quartz similar to that of the holding plate 75. The guide ring 76 may be welded to the upper surface of the holding plate 75 or fixed to the holding plate 75 with separately machined pins and the like. Alternatively, the holding plate 75 and the guide ring 76 may be machined as an integral member.

A region of the upper surface of the holding plate 75 which is inside the guide ring 76 serves as a planar holding surface 75a for holding the semiconductor wafer W. The substrate support pins 77 are provided upright on the holding surface 75a of the holding plate 75. In the present preferred embodiment, a total of 12 substrate support pins 77 are spaced at intervals of 30 degrees along the circumference of a circle concentric with the outer circumference of the holding surface 75a (the inner circumference of the guide ring 76). The diameter of the circle on which the 12 substrate support pins 77 are disposed (the distance between opposed ones of the substrate support pins 77) is smaller than the diameter of the semiconductor wafer W, and is 270 to 280 mm (in the present preferred embodiment, 270 mm) when the diameter of the semiconductor wafer W is 300 mm. Each of the substrate support pins 77 is made of quartz. The substrate support pins 77 may be provided by welding on the upper surface of the holding plate 75 or machined integrally with the holding plate 75.

Referring again to FIG. 2, the four coupling portions 72 provided upright on the base ring 71 and the peripheral portion of the holding plate 75 of the susceptor 74 are rigidly secured to each other by welding. In other words, the susceptor 74 and the base ring 71 are fixedly coupled to each other with the coupling portions 72. The base ring 71 of such a holder 7 is supported by the wall surface of the chamber 6, whereby the holder 7 is mounted to the chamber 6. With the holder 7 mounted to the chamber 6, the holding plate 75 of the susceptor 74 assumes a horizontal attitude (an attitude such that the normal to the holding plate 75 coincides with a vertical direction). In other words, the holding surface 75a of the holding plate 75 becomes a horizontal surface.

A semiconductor wafer W transported into the chamber 6 is placed and held in a horizontal attitude on the susceptor 74 of the holder 7 mounted to the chamber 6. At this time, the semiconductor wafer W is supported by the 12 substrate support pins 77 provided upright on the holding plate 75, and is held by the susceptor 74. More strictly speaking, the 12 substrate support pins 77 have respective upper end portions coming in contact with the lower surface of the semiconductor wafer W to support the semiconductor wafer W. The semiconductor wafer W is supported in a horizontal attitude by the 12 substrate support pins 77 because the 12 substrate support pins 77 have a uniform height (distance from the upper ends of the substrate support pins 77 to the holding surface 75a of the holding plate 75).

The semiconductor wafer W supported by the substrate support pins 77 is spaced a predetermined distance apart from the holding surface 75a of the holding plate 75. The thickness of the guide ring 76 is greater than the height of the substrate support pins 77. Thus, the guide ring 76 prevents the horizontal misregistration of the semiconductor wafer W supported by the substrate support pins 77.

As shown in FIGS. 2 and 3, an opening 78 is provided in the holding plate 75 of the susceptor 74 so as to extend vertically through the holding plate 75 of the susceptor 74. The opening 78 is provided for a radiation thermometer 120 (with reference to FIG. 1) to receive radiation (infrared radiation) emitted from the lower surface of the semiconductor wafer W. Specifically, the radiation thermometer 120 receives the radiation emitted from the lower surface of the semiconductor wafer W through the opening 78 to measure the temperature of the semiconductor wafer W. Further, the holding plate 75 of the susceptor 74 further includes four through holes 79 bored therein and designed so that lift pins 12 of the transfer mechanism 10 to be described later pass through the through holes 79, respectively, to transfer a semiconductor wafer W.

Figure 5:
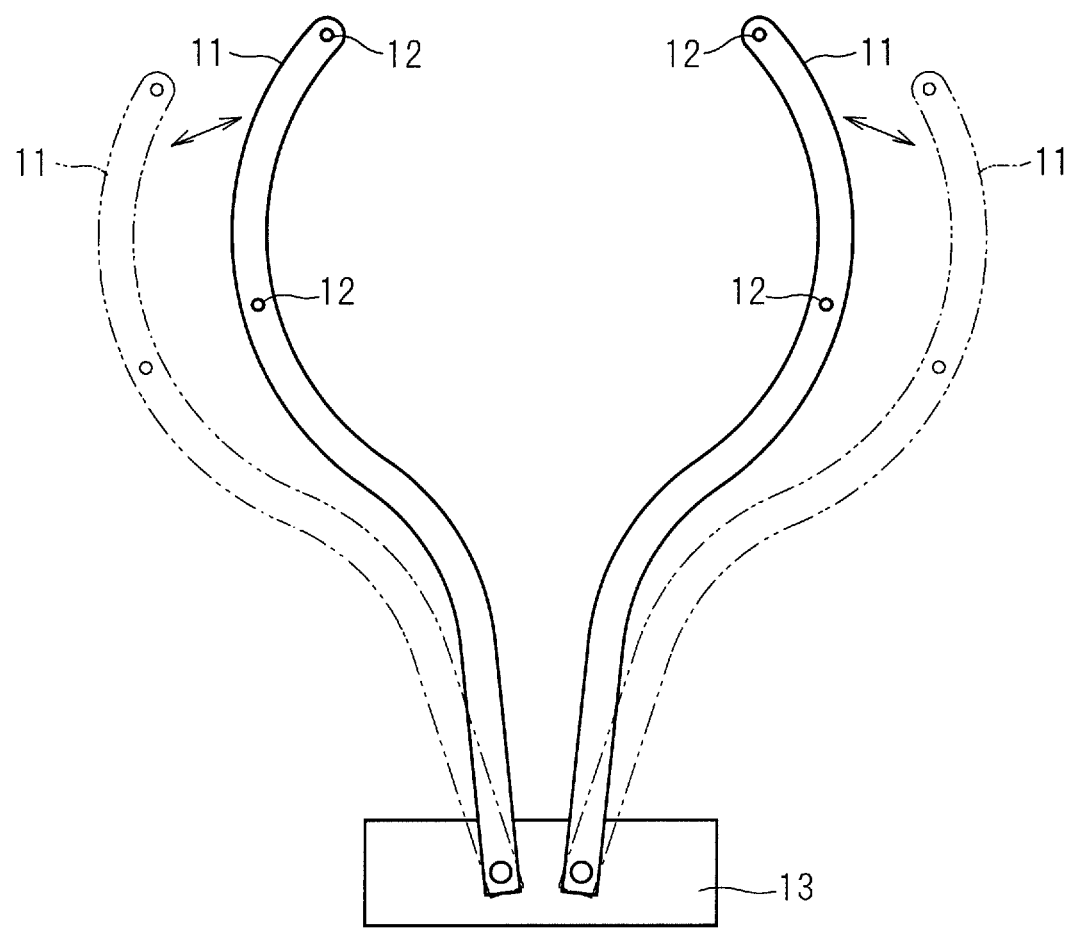
FIG. 5 is a plan view of a transfer mechanism.
Figure 6:
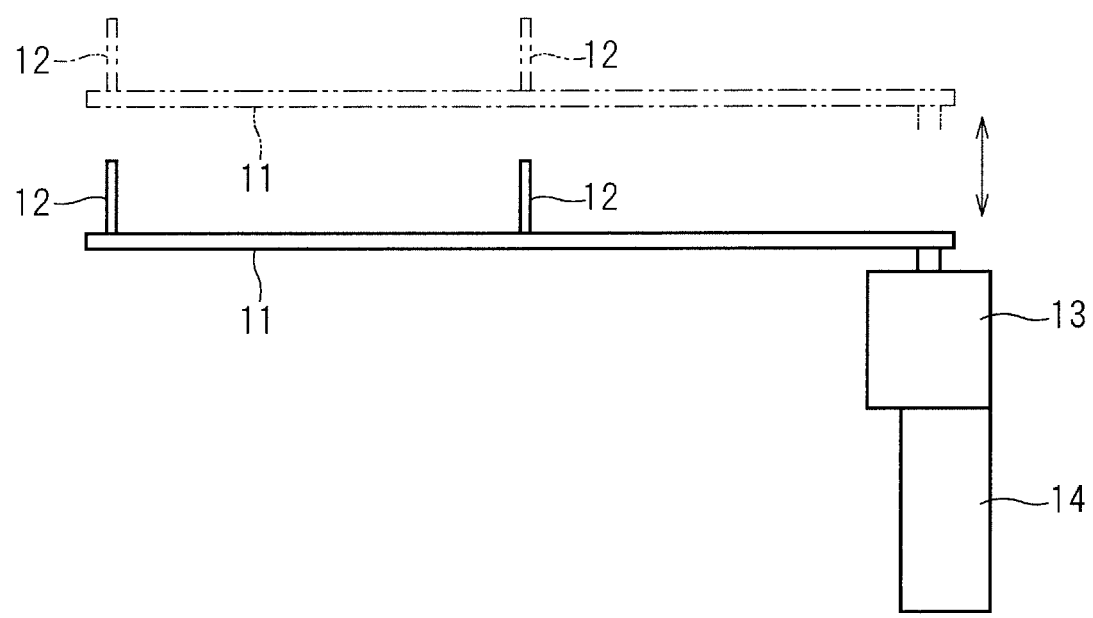
FIG. 6 is a side view of the transfer mechanism.

FIG. 5 is a plan view of the transfer mechanism 10. FIG. 6 is a side view of the transfer mechanism 10. The transfer mechanism 10 includes the two transfer arms 11. The transfer arms 11 are of an arcuate configuration extending substantially along the annular recessed portion 62. Each of the transfer arms 11 includes the two lift pins 12 mounted upright thereon. The transfer arms 11 and the lift pins 12 are made of quartz. The transfer arms 11 are pivotable by a horizontal movement mechanism 13. The horizontal movement mechanism 13 moves the pair of transfer arms 11 horizontally between a transfer operation position (a position indicated by solid lines in FIG. 5) in which a semiconductor wafer W is transferred to and from the holder 7 and a retracted position (a position indicated by dash-double-dot lines in FIG. 5) in which the transfer arms 11 do not overlap the semiconductor wafer W held by the holder 7 as seen in plan view. The horizontal movement mechanism 13 may be of the type which causes individual motors to pivot the transfer arms 11 respectively or of the type which uses a linkage mechanism to cause a single motor to pivot the pair of transfer arms 11 in cooperative relation.

The transfer arms 11 are moved upwardly and downwardly together with the horizontal movement mechanism 13 by an elevating mechanism 14. As the elevating mechanism 14 moves up the pair of transfer arms 11 in their transfer operation position, the four lift pins 12 in total pass through the respective four through holes 79 (with reference to FIGS. 2 and 3) bored in the susceptor 74, so that the upper ends of the lift pins 12 protrude from the upper surface of the susceptor 74. On the other hand, as the elevating mechanism 14 moves down the pair of transfer arms 11 in their transfer operation position to take the lift pins 12 out of the respective through holes 79 and the horizontal movement mechanism 13 moves the pair of transfer arms 11 so as to open the transfer arms 11, the transfer arms 11 move to their retracted position. The retracted position of the pair of transfer arms 11 is immediately over the base ring 71 of the holder 7. The retracted position of the transfer arms 11 is inside the recessed portion 62 because the base ring 71 is placed on the bottom surface of the recessed portion 62. An exhaust mechanism not shown is also provided near the location where the drivers (the horizontal movement mechanism 13 and the elevating mechanism 14) of the transfer mechanism 10 are provided, and is configured to exhaust an atmosphere around the drivers of the transfer mechanism 10 to the outside of the chamber 6.

As shown in FIG. 1, the heat treatment apparatus 1 is provided with three radiation thermometers 120, 130 and 140. As mentioned above, the radiation thermometer 120 measures the temperature of the lower surface of the semiconductor wafer W through the opening 78 provided in the susceptor 74. The radiation thermometer 130 senses infrared radiation emitted from a center portion of the susceptor 74 to measure the temperature of the center portion of the susceptor 74. The radiation thermometer 140, on the other hand, senses infrared radiation emitted from the upper surface of the semiconductor wafer W to measure the temperature of the upper surface of the semiconductor wafer W. The radiation thermometer 140 to be adopted herein is preferably a high-speed radiation thermometer capable of following a rapid change in temperature of the upper surface of the semiconductor wafer W at the moment when the semiconductor wafer W is irradiated with flashes of light from the flash lamps FL. The heat treatment apparatus 1 is further provided with a temperature sensor 150. The temperature sensor 150 measures an atmospheric temperature of the heat treatment space 65 in the chamber 6.

The flash heating part 5 provided over the chamber 6 includes an enclosure 51, a light source provided inside the enclosure 51 and including the multiple (in the present preferred embodiment, 30) xenon flash lamps FL, and a reflector 52 provided inside the enclosure 51 so as to cover the light source from above. The flash heating part 5 further includes a lamp light radiation window 53 mounted to the bottom of the enclosure 51. The lamp light radiation window 53 forming the floor of the flash heating part 5 is a plate-like quartz window made of quartz. The flash heating part 5 is provided over the chamber 6, whereby the lamp light radiation window 53 is opposed to the upper chamber window 63. The flash lamps FL direct flashes of light from over the chamber 6 through the lamp light radiation window 53 and the upper chamber window 63 toward the heat treatment space 65.

The flash lamps FL, each of which is a rod-shaped lamp having an elongated cylindrical shape, are arranged in a plane so that the longitudinal directions of the respective flash lamps FL are in parallel with each other along a main surface of a semiconductor wafer W held by the holder 7 (that is, in a horizontal direction). Thus, a plane defined by the arrangement of the flash lamps FL is also a horizontal plane.

Each of the xenon flash lamps FL includes a rod-shaped glass tube (discharge tube) containing xenon gas sealed therein and having positive and negative electrodes provided on opposite ends thereof and connected to a capacitor, and a trigger electrode attached to the outer peripheral surface of the glass tube. Because the xenon gas is electrically insulative, no current flows in the glass tube in a normal state even if electrical charge is stored in the capacitor. However, if a high voltage is applied to the trigger electrode to produce an electrical breakdown, electricity stored in the capacitor flows momentarily in the glass tube, and xenon atoms or molecules are excited at this time to cause light emission. Such a xenon flash lamp FL has the property of being capable of emitting extremely intense light as compared with a light source that stays lit continuously such as a halogen lamp HL because the electrostatic energy previously stored in the capacitor is converted into an ultrashort light pulse ranging from 0.1 to 100 milliseconds. Thus, the flash lamps FL are pulsed light emitting lamps which emit light instantaneously for an extremely short time period of less than one second. The light emission time of the flash lamps FL is adjustable by the coil constant of a lamp light source which supplies power to the flash lamps FL.

The reflector 52 is provided over the plurality of flash lamps FL so as to cover all of the flash lamps FL. A fundamental function of the reflector 52 is to reflect flashes of light emitted from the plurality of flash lamps FL toward the heat treatment space 65. The reflector 52 is a plate made of an aluminum alloy. A surface of the reflector 52 (a surface which faces the flash lamps FL) is roughened by abrasive blasting.

The halogen heating part 4 provided under the chamber 6 includes an enclosure 41 incorporating the multiple (in the present preferred embodiment, 40) halogen lamps HL. The halogen heating part 4 directs light from under the chamber 6 through the lower chamber window 64 toward the heat treatment space 65 to heat the semiconductor wafer W by means of the halogen lamps HL.

FIG. 7 is a plan view showing an arrangement of the multiple halogen lamps HL. The 40 halogen lamps HL are arranged in two tiers, i.e. upper and lower tiers. That is, 20 halogen lamps HL are arranged in the upper tier closer to the holder 7, and 20 halogen lamps HL are arranged in the lower tier farther from the holder 7 than the upper tier. Each of the halogen lamps HL is a rod-shaped lamp having an elongated cylindrical shape. The 20 halogen lamps HL in each of the upper and lower tiers are arranged so that the longitudinal directions thereof are in parallel with each other along a main surface of a semiconductor wafer W held by the holder 7 (that is, in a horizontal direction). Thus, a plane defined by the arrangement of the halogen lamps HL in each of the upper and lower tiers is also a horizontal plane.

As shown in FIG. 7, the halogen lamps HL in each of the upper and lower tiers are disposed at a higher density in a region opposed to the peripheral portion of the semiconductor wafer W held by the holder 7 than in a region opposed to the central portion thereof. In other words, the halogen lamps HL in each of the upper and lower tiers are arranged at shorter intervals in the peripheral portion of the lamp arrangement than in the central portion thereof. This allows a greater amount of light to impinge upon the peripheral portion of the semiconductor wafer W where a temperature decrease is prone to occur when the semiconductor wafer W is heated by the irradiation thereof with light from the halogen heating part 4.

The group of halogen lamps HL in the upper tier and the group of halogen lamps HL in the lower tier are arranged to intersect each other in a lattice pattern. In other words, the 40 halogen lamps HL in total are disposed so that the longitudinal direction of the 20 halogen lamps HL arranged in the upper tier and the longitudinal direction of the 20 halogen lamps HL arranged in the lower tier are orthogonal to each other.

Each of the halogen lamps HL is a filament-type light source which passes current through a filament disposed in a glass tube to make the filament incandescent, thereby emitting light. A gas prepared by introducing a halogen element (iodine, bromine and the like) in trace amounts into an inert gas such as nitrogen, argon and the like is sealed in the glass tube. The introduction of the halogen element allows the temperature of the filament to be set at a high temperature while suppressing a break in the filament. Thus, the halogen lamps HL have the properties of having a longer life than typical incandescent lamps and being capable of continuously emitting intense light. That is, the halogen lamps HL are continuous lighting lamps that emit light continuously for not less than one second. In addition, the halogen lamps HL, which are rod-shaped lamps, have a long life. The arrangement of the halogen lamps HL in a horizontal direction provides good efficiency of radiation toward the semiconductor wafer W provided over the halogen lamps HL.

A reflector 43 is provided also inside the enclosure 41 of the halogen heating part 4 under the halogen lamps HL arranged in two tiers (FIG. 1). The reflector 43 reflects the light emitted from the halogen lamps HL toward the heat treatment space 65.

The controller 3 controls the aforementioned various operating mechanisms provided in the heat treatment apparatus 1. The controller 3 is similar in hardware configuration to a typical computer. Specifically, the controller 3 includes a CPU that is a circuit for performing various computation processes, a ROM or read-only memory for storing a basic program therein, a RAM or readable/writable memory for storing various pieces of information therein, and a magnetic disk for storing control software, data and the like thereon. The CPU in the controller 3 executes a predetermined processing program, whereby the processes in the heat treatment apparatus 1 proceed.

FIG. 8 is a functional block diagram of the radiation thermometers 120 and 140 and the controller 3. The radiation thermometer 120 which measures a temperature of a lower surface of a semiconductor wafer W includes an infrared sensor 121 and a temperature measurement unit 122. The infrared sensor 121 receives infrared radiation emitted from the lower surface of the semiconductor wafer W held by the susceptor 74 through the opening 78. The infrared sensor 121 is electrically connected to the temperature measurement unit 122, and transmits to the temperature measurement unit 122 a signal generated in response to the received infrared radiation. The temperature measurement unit 122 includes an amplification circuit, an A/D converter, a temperature conversion circuit and the like not shown, and converts into a temperature a signal indicating the intensity of infrared radiation output from the infrared sensor 121. The temperature obtained by the temperature measurement unit 122 corresponds to a temperature of a lower surface of a semiconductor wafer W.

On the other hand, the radiation thermometer 140 which measures a temperature of an upper surface of a semiconductor wafer W includes an infrared sensor 141 and a temperature measurement unit 142. The infrared sensor 141 receives infrared radiation emitted from the upper surface of the semiconductor wafer W held by the susceptor 74. The infrared sensor 141 includes an InSb (indium antimony)-based optical element so as to be capable of coping with a rapid change in temperature of the upper surface of the semiconductor wafer W at the moment when the semiconductor wafer W is irradiated with flashes of light. The infrared sensor 141 is electrically connected to the temperature measurement unit 142, and transmits to the temperature measurement unit 142 a signal generated in response to the received infrared radiation. The temperature measurement unit 142 converts into a temperature a signal indicating the intensity of infrared radiation output from the infrared sensor 141. The temperature obtained by the temperature measurement unit 142 corresponds to a temperature of an upper surface of a semiconductor wafer W. It should be noted that the radiation thermometer 130 which measures a temperature of the susceptor 74 is substantially similar in configuration to the radiation thermometers 120 and 140.

The radiation thermometers 120 and 140 are electrically connected to the controller 3 which controls the whole of the heat treatment apparatus 1. The radiation thermometers 120 and 140 transmit to the controller 3 measured temperatures of lower and upper surfaces of a semiconductor wafer W. The controller 3 includes an integration part 31 and a cracking determination part 32. The integration part 31 and the cracking determination part 32 are functional processing parts implemented by the CPU of the controller 3 executing a predetermined processing program. The processing of each of the integration part 31 and the cracking determination part 32 will be further detailed later.

In addition, a display part 33 and an input part 34 are connected to the controller 3. The controller 3 displays various pieces of information on the display part 33. The input part 34 is a device which allows an operator of the heat treatment apparatus 1 to input various commands and parameters to the controller 3. The operator can also set conditions on a treatment recipe describing a procedure for and conditions on a treatment of a semiconductor wafer W through the input part 34 while checking the details of display on the display part 33. The display part 33 and the input part 34 to be used herein may be a touch panel having a display function and an input function. In the present preferred embodiment, the display part 33 and the input part 34 are provided in the form of a liquid crystal touch panel on the outer wall of the heat treatment apparatus 1.

The heat treatment apparatus 1 further includes, in addition to the aforementioned components, various cooling structures to prevent an excessive temperature rise in the halogen heating part 4, the flash heating part 5 and the chamber 6 because of the heat energy generated from the halogen lamps HL and the flash lamps FL during the heat treatment of a semiconductor wafer W. As an example, a water cooling tube (not shown) is provided in the walls of the chamber 6. Also, the halogen heating part 4 and the flash heating part 5 have an air cooling structure for forming a gas flow therein to exhaust heat. In addition, air is supplied to a gap between the upper chamber window 63 and the lamp light radiation window 53 to cool the flash heating part 5 and the upper chamber window 63.

Next, the procedure for the treatment of a semiconductor wafer W in the heat treatment apparatus 1 will be described. FIG. 9 is a flowchart showing the procedure for the treatment of a semiconductor wafer W. A semiconductor wafer W to be treated herein is a semiconductor substrate doped with impurities (ions) by an ion implantation process. The impurities are activated by the heat treatment apparatus 1 performing the process of heating (annealing) the semiconductor wafer W by means of flash irradiation. The procedure for the treatment in the heat treatment apparatus 1 which will be described below proceeds under the control of the controller 3 over the operating mechanisms of the heat treatment apparatus 1.

First, the valve 84 is opened for supply of gas, and the valves 89 and 192 for exhaust of gas are opened, so that the supply and exhaust of gas into and out of the chamber 6 start. When the valve 84 is opened, nitrogen gas is supplied through the gas supply opening 81 into the heat treatment space 65. When the valve 89 is opened, the gas within the chamber 6 is exhausted through the gas exhaust opening 86. This causes the nitrogen gas supplied from an upper portion of the heat treatment space 65 in the chamber 6 to flow downwardly and then to be exhausted from a lower portion of the heat treatment space 65.

The gas within the chamber 6 is exhausted also through the transport opening 66 by opening the valve 192. Further, the exhaust mechanism not shown exhausts an atmosphere near the drivers of the transfer mechanism 10. It should be noted that the nitrogen gas is continuously supplied into the heat treatment space 65 during the heat treatment of a semiconductor wafer W in the heat treatment apparatus 1. The amount of nitrogen gas supplied into the heat treatment space 65 is changed as appropriate in accordance with process steps.

Subsequently, the gate valve 185 is opened to open the transport opening 66. A transport robot outside the heat treatment apparatus 1 transports a semiconductor wafer W to be treated through the transport opening 66 into the heat treatment space 65 of the chamber 6 (step S1). At this time, there is a danger that an atmosphere outside the heat treatment apparatus 1 is carried into the heat treatment space 65 as the semiconductor wafer W is transported into the heat treatment space 65. However, the nitrogen gas is continuously supplied into the chamber 6. Thus, the nitrogen gas flows outwardly through the transport opening 66 to minimize the outside atmosphere carried into the heat treatment space 65.

The semiconductor wafer W transported into the heat treatment space 65 by the transport robot is moved forward to a position lying immediately over the holder 7 and is stopped thereat. Then, the pair of transfer arms 11 of the transfer mechanism 10 is moved horizontally from the retracted position to the transfer operation position and is then moved upwardly, whereby the lift pins 12 pass through the through holes 79 and protrude from the upper surface of the holding plate 75 of the susceptor 74 to receive the semiconductor wafer W. At this time, the lift pins 12 move upwardly to above the upper ends of the substrate support pins 77.

After the semiconductor wafer W is placed on the lift pins 12, the transport robot moves out of the heat treatment space 65, and the gate valve 185 closes the transport opening 66. Then, the pair of transfer arms 11 moves downwardly to transfer the semiconductor wafer W from the transfer mechanism 10 to the susceptor 74 of the holder 7, so that the semiconductor wafer W is held in a horizontal attitude from below. The semiconductor wafer W is supported by the substrate support pins 77 provided upright on the holding plate 75, and is held by the susceptor 74. The semiconductor wafer W is held by the holder 7 in such an attitude that the front surface thereof patterned and implanted with impurities is the upper surface. A predetermined distance is defined between the back surface (a main surface opposite from the front surface) of the semiconductor wafer W supported by the substrate support pins 77 and the holding surface 75a of the holding plate 75. The pair of transfer arms 11 moved downwardly below the susceptor 74 is moved back to the retracted position, i.e. to the inside of the recessed portion 62, by the horizontal movement mechanism 13.

At the time when the semiconductor wafer W is held in the horizontal attitude from below by the susceptor 74 of the holder 7 made of quartz, the radiation thermometer 120 and the radiation thermometer 140 start temperature measurement. Specifically, the radiation thermometer 120 receives infrared radiation emitted from the lower surface (back surface) of the semiconductor wafer W held by the susceptor 74 through the opening 78 to measure a back surface temperature of the semiconductor wafer W. Also, the radiation thermometer 140 receives infrared radiation emitted from the upper surface (front surface) of the semiconductor wafer W held by the susceptor 74 to measure a front surface temperature of the semiconductor wafer W.

Figure 10:
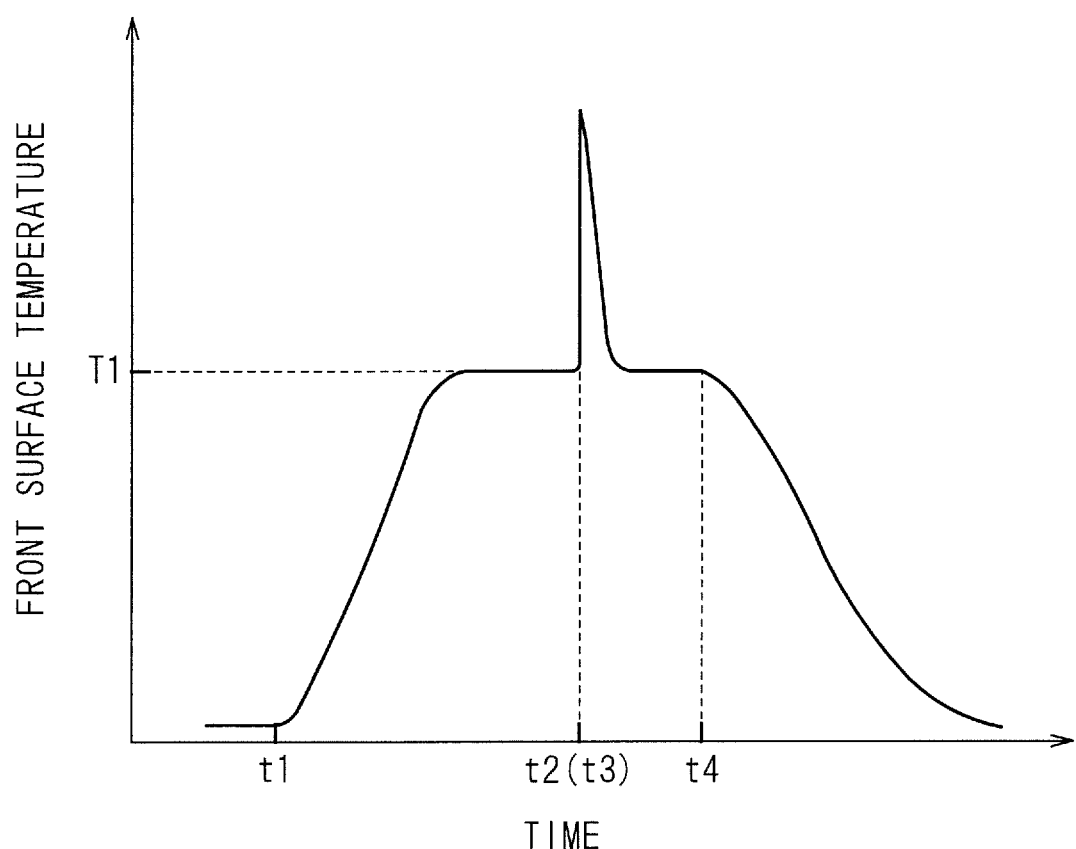
FIG. 10 is a graph showing a change in front surface temperature of a semiconductor wafer measured by the radiation thermometer.

FIG. 10 is a graph showing a change in front surface temperature of the semiconductor wafer W measured by the radiation thermometer 140. After the semiconductor wafer W is transported into the chamber 6 and is held by the susceptor 74, the 40 halogen lamps HL in the halogen heating part 4 turn on simultaneously to start preheating (or assist-heating) at a time t1 (step S2). Halogen light emitted from the halogen lamps HL is transmitted through the lower chamber window 64 and the susceptor 74 both made of quartz, and impinges upon the lower surface of the semiconductor wafer W. By receiving light irradiation from the halogen lamps HL, the semiconductor wafer W is preheated, so that the temperature of the semiconductor wafer W increases. It should be noted that the transfer arms 11 of the transfer mechanism 10, which are retracted to the inside of the recessed portion 62, do not become an obstacle to the heating using the halogen lamps HL.

The temperature of the semiconductor wafer W which is on the increase by the irradiation with light from the halogen lamps HL is measured with the radiation thermometer 120. The measured temperature of the semiconductor wafer W is transmitted to the controller 3. The controller 3 controls the output from the halogen lamps HL while monitoring whether the temperature of the semiconductor wafer W which is on the increase by the irradiation with light from the halogen lamps HL reaches a predetermined preheating temperature T1 or not. In other words, the controller 3 effects feedback control of the output from the halogen lamps HL so that the temperature of the semiconductor wafer W is equal to the preheating temperature T1, based on the value measured with the radiation thermometer 120. The preheating temperature T1 shall be on the order of 200° C. to 800° C., preferably on the order of 350° C. to 600° C., (in the present preferred embodiment, 600° C.) at which there is no apprehension that the impurities implanted in the semiconductor wafer W are diffused by heat. As mentioned above, the radiation thermometer 120 is a temperature sensor for controlling output from the halogen lamps HL at the preheating stage. The radiation thermometer 120 measures the back surface temperature of the semiconductor wafer W. However, there is no temperature difference between the front and back surfaces of the semiconductor wafer W at the preheating stage with the halogen lamps HL. The back surface temperature measured with the radiation thermometer 120 can therefore be regarded as the temperature of the entire semiconductor wafer W.

After the temperature of the semiconductor wafer W reaches the preheating temperature T1, the controller 3 maintains the temperature of the semiconductor wafer W at the preheating temperature T1 for a short time. Specifically, at the point in time when the temperature of the semiconductor wafer W measured with the radiation thermometer 120 reaches the preheating temperature T1, the controller 3 adjusts the output from the halogen lamps HL to maintain the temperature of the semiconductor wafer W at approximately the preheating temperature T1.

Achieving such preheating with the halogen lamps HL allows uniform increase in temperature of the entire semiconductor wafer W to the preheating temperature T1. At the preheating stage with the halogen lamps HL, the temperature of the peripheral portion of the semiconductor wafer W which is apt to release heat tends to be lower than that of the central portion thereof. In the halogen heating part 4, however, the density of halogen lamps HL in the region opposed to the peripheral portion of the semiconductor wafer W is higher than that in the region opposed to the central portion thereof. This increases an amount of light impinging on the peripheral portion of the semiconductor wafer W which is apt to release heat, so that in-plane temperature distribution in the semiconductor wafer W can be made uniform at the preheating stage.

The flash lamps FL in the flash heating part 5 irradiate the front surface of the semiconductor wafer W supported by the susceptor 74 with a flash of light at a time t2 when a predetermined time period has elapsed since the temperature of the semiconductor wafer W reached the preheating temperature T1 (step S3). At this time, part of the flash of light emitted from the flash lamps FL travels directly toward the interior of the chamber 6. The remainder of the flash of light is reflected once from the reflector 52, and then travels toward the interior of the chamber 6. The irradiation of the semiconductor wafer W with such flashes of light achieves the flash heating of the semiconductor wafer W.

The flash heating, which is achieved by the emission of a flash of light from the flash lamps FL, is capable of increasing the front surface temperature of the semiconductor wafer W in a short time. Specifically, the flash of light emitted from the flash lamps FL is an intense flash of light emitted for an extremely short period of time ranging from about 0.1 to about 100 milliseconds as a result of the conversion of the electrostatic energy previously stored in the capacitor into such an ultrashort light pulse. The front surface temperature of the semiconductor wafer W subjected to the flash heating by the flash irradiation from the flash lamps FL momentarily increases to a treatment temperature T2 of 1000° C. or higher. After the impurities implanted in the semiconductor wafer W are activated, the front surface temperature of the semiconductor wafer W decreases rapidly. Because of the capability of increasing and decreasing the front surface temperature of the semiconductor wafer W in an extremely short time, the heat treatment apparatus 1 achieves the activation of the impurities implanted in the semiconductor wafer W while suppressing the diffusion of the impurities due to heat. It should be noted that the time required for the activation of the impurities is extremely short as compared with the time required for the thermal diffusion of the impurities. Thus, the activation is completed in a short time ranging from about 0.1 to about 100 milliseconds during which no diffusion occurs.

The flash heating rapidly increases the front surface temperature of the semiconductor wafer W by irradiation of a flash of light for an extremely short time. The flash heating therefore causes a temperature difference between the front and back surfaces of the semiconductor wafer W. Specifically, the front surface temperature of the semiconductor wafer W irradiated with the flash of light increases first, and then the back surface temperature thereof increases by heat transfer from the front surface with a delay. In addition, the highest temperature at the back surface of the semiconductor wafer W at the time of flash heating is lower than the highest temperature (treatment temperature T2) at the front surface. Immediately after the flash irradiation, thus, a result of temperature measurement by the radiation thermometer 120 is different from a result of temperature measurement by the radiation thermometer 140. At the time of flash heating, in addition, the change in back surface temperature of the semiconductor wafer W is gentler than the change in front surface temperature thereof.

The flash of light is emitted for an extremely short period of time ranging from about 0.1 to about 100 milliseconds, and the flash lamps FL turn off at a time t3 when this period of time has elapsed from the time t2 when the flash irradiation starts. After the light emission from the flash lamps FL ends, the halogen lamps HL continuously turn on for a short time. The halogen lamps HL turn off at a time t4 subsequent to the time t3. Thus, the preheating of the semiconductor wafer W with the halogen lamps HL ends at the time t4. It should be noted that because a period between the time t2 when the light emission from the flash lamps FL starts and the time t3 when the light emission from the flash lamps FL ends is extremely short, the time t2 and the time t3 overlap each other in FIG. 10 for convenience of illustration.

After the time t2 when the flash irradiation starts, the radiation thermometer 140 measures the front surface temperature of the semiconductor wafer W, and the radiation thermometer 120 measures the back surface temperature of the semiconductor wafer W. Then, the integration part 31 integrates the front surface temperatures of the semiconductor wafer W measured by the radiation thermometer 140 during a period from the time t2 when the flash irradiation starts to the time t4 when the preheating of the semiconductor wafer W with the halogen lamps HL ends to calculate a front surface temperature integrated value FS (step S4). Specifically, the radiation thermometer 140 measures the front surface temperature of the semiconductor wafer W at predetermined sampling intervals. The integration part 31 sequentially adds all the front surface temperatures of the semiconductor wafer W measured at the sampling intervals during the period from the time t2 to the time t4, thereby calculating the front surface temperature integrated value FS. In addition, the integration part 31 integrates the back surface temperatures of the semiconductor wafer W measured by the radiation thermometer 120 during the period from the time t2 to the time t4 to calculate a back surface temperature integrated value BS. Specifically, the radiation thermometer 120 also measures the back surface temperature of the semiconductor wafer W at predetermined sampling intervals. The integration part 31 also sequentially adds all the back surface temperatures of the semiconductor wafer W measured at the sampling intervals during the period from the time t2 to the time t4, thereby calculating the back surface temperature integrated value BS.

Next, the cracking determination part 32 determines whether the semiconductor wafer W is cracked at the time of flash irradiation, based on the front surface temperature integrated value FS and the back surface temperature integrated value BS (step S5). When the semiconductor wafer W is cracked at the time of flash irradiation, the cracking hinders the temperature measurement by the radiation thermometers 120 and 140, so that abnormal temperature measured values are obtained. As a result, a front surface temperature integrated value FS and a back surface temperature integrated value BS obtained by integration of such abnormal temperature measured values are also abnormal. For this reason, a determination as to whether the front surface temperature integrated value FS and the back surface temperature integrated value BS fall within an appropriate range or not enables a determination as to whether the semiconductor wafer W is cracked.

Specifically, the cracking determination part 32 determines whether the semiconductor wafer W is cracked, based on the following formulas (1) and (2). In the formula (1), FL represents a lower limit value for cracking determination. In the formula (2), BL represents a lower limit value for cracking determination. In the formula (1), FU represents an upper limit value for cracking determination. In the formula (2), BU represents an upper limit value for cracking determination.

$$FL<FS<FU \quad (1)$$

$$BL<BS<BU \quad (2)$$

The upper limit value FU, the upper limit value BU, the lower limit value FL and the lower limit value BL are set as recipe parameters. The recipe parameters refer to parameters set for a treatment recipe describing a procedure for and conditions on a treatment of a semiconductor wafer W. A treatment recipe is given to the controller 3 for each semiconductor wafer W to be treated, and the recipe parameters can be set for each semiconductor wafer W. For example, the operator of the heat treatment apparatus 1 can set and input, as the recipe parameters, numeric values of the upper limit value FU, upper limit value BU, lower limit value FL and lower limit value BL through the input part 34 before starting the treatment of the semiconductor wafer W.

In the first preferred embodiment, when both the formulas (1) and (2) are satisfied, the cracking determination part 32 determines that the semiconductor wafer W is not cracked. In other words, when at least one of the formula (1) or the formula (2) is not satisfied, the cracking determination part 32 determines that the semiconductor wafer W is cracked. That is, the cracking determination part 32 determines that the semiconductor wafer W is cracked when the front surface temperature integrated value FS deviates from a preset range between the upper limit value FU and the lower limit value FL or when the back surface temperature integrated value BS deviates from a preset range between the upper limit value BU and the lower limit value BL.

Accordingly, the upper limit value FU and the lower limit value FL are preferably set using a value obtained by adding a predetermined margin to a reference value and a value obtained by subtracting the predetermined margin from the reference value. The reference value corresponds to a front surface temperature integrated value obtained when no wafer cracking occurs, for example. Likewise, the upper limit value BU and the lower limit value BL are preferably set using a value obtained by adding a predetermined margin to a reference value and a value obtained by subtracting the predetermined margin from the reference value. The reference value corresponds to a back surface temperature integrated value obtained when no wafer cracking occurs, for example. A severe cracking determination is made as a range between the upper limit value FU and the lower limit value FL and a range between the upper limit value BU and the lower limit value BL become narrower.

When the cracking determination part 32 determines that the semiconductor wafer W is not cracked, the procedure proceeds from step S6 to step S7 in which the semiconductor wafer W is subjected to a cooling treatment. The cooling treatment starts after the time t4 until which the heating treatment (including both the preheating with the halogen lamps HL and the flash heating with the flash lamps FL) on the semiconductor wafer W has completed. In the cooling treatment, a cooling gas (helium, argon or nitrogen) is supplied into the heat treatment space 65 through the gas supply opening 81. In the case where a nitrogen gas is used in both the heating treatment and the cooling treatment, an amount of the nitrogen gas to be supplied is increased in the cooling treatment. When the supplied cooling gas cools the semiconductor wafer W, the cooling treatment of the semiconductor wafer W proceeds.

After the cooling treatment ends, the semiconductor wafer W is transported out of the chamber 6 (step S8). Specifically, after the temperature of the semiconductor wafer W monitored by the radiation thermometer 120 is decreased to the predetermined temperature or below, the pair of transfer arms 11 of the transfer mechanism 10 is moved horizontally again from the retracted position to the transfer operation position and is then moved upwardly, so that the lift pins 12 protrude from the upper surface of the susceptor 74 to receive the semiconductor wafer W from the susceptor 74. Subsequently, the transport opening 66 which has been closed is opened by the gate valve 185, and the transport robot outside the heat treatment apparatus 1 transports the semiconductor wafer W placed on the lift pins 12 to the outside. Thus, the heat treatment apparatus 1 completes the heating treatment of the semiconductor wafer W.

On the other hand, when the cracking determination part 32 determines that the semiconductor wafer W is cracked, the procedure proceeds from step S6 to step S9 in which the controller 3 suspends the processes in the heat treatment apparatus 1. In the case where the processes are suspended based on the determination that the semiconductor wafer W is cracked, the cooling treatment is not achieved, and the supply of the gas into the chamber 6 is also stopped. In addition, the operation of the transport system for transporting the semiconductor wafer W into and out of the chamber 6 is also stopped. Further, the controller 3 may give a warning about the occurrence of wafer cracking to the display part 33. Thus, the fragments of the cracked semiconductor wafer W and the particles generated due to the cracking are confined in the chamber 6 as an enclosed space. Then, the chamber 6 is opened and subjected to cleaning work because the particles generate in the chamber 6 when the semiconductor wafer W is cracked.

In the first preferred embodiment, the front surface temperatures and back surface temperatures of the semiconductor wafer W measured during the period from the time t2 when the flash irradiation starts to the time t4 when the preheating of the semiconductor wafer W with the halogen lamps HL ends are respectively integrated to calculate the front surface temperature integrated value FS and the back surface temperature integrated value BS. Then, the cracking determination part 32 determines whether the semiconductor wafer W is cracked at the time of flash irradiation, based on the front surface temperature integrated value FS and the back surface temperature integrated value BS. Accordingly, the determination as to whether the semiconductor wafer W is cracked is made before the cooling treatment starts after the time t4. Thus, in the case where the semiconductor wafer W is cracked at the time of flash irradiation, the wafer cracking is detected before the cooling treatment starts, and the processes are suspended before the cooling treatment, so that the cooling treatment is not achieved at all. As a result, it is possible to prevent increase in and diffusion of particles generated when the cooling gas is supplied into the chamber 6 although the semiconductor wafer W is cracked. It is thus possible to prevent another semiconductor wafer W from being contaminated.

In addition, the cracking of the semiconductor wafer W occurring at the time of flash irradiation is detected using such a simple configuration that the heat treatment apparatus 1 is provided with the radiation thermometers 120 and 140. Further, there is no possibility of throughput reduction because the temperatures measured by the radiation thermometers 120 and 140 are subjected to a simple computation process, whereby the cracking of the semiconductor wafer W is detected. That is, the heat treatment apparatus 1 according to the present preferred embodiment is capable of rapidly detecting cracking of a semiconductor wafer W at the time of flash irradiation with a simple configuration.

<Second Preferred Embodiment>

Next, a second preferred embodiment according to the present invention will be described. A heat treatment apparatus 1 according to the second preferred embodiment is identical in configuration to that according to the first preferred embodiment. In addition, a procedure for a treatment of a semiconductor wafer W in the heat treatment apparatus 1 according to the second preferred embodiment is substantially similar to that according to the first preferred embodiment. In the second preferred embodiment, however, a semiconductor wafer W is subjected to a heating treatment under an atmosphere of a reactive gas such as ammonia. The second preferred embodiment is substantially different from the first preferred embodiment in terms of a temperature measured value integration period and a cracking detecting method.

In the second preferred embodiment, an integration part 31 integrates front surface temperatures of a semiconductor wafer W measured by a radiation thermometer 140 during a period from a time t2 when flash irradiation starts to a time t3 when flash heating of the semiconductor wafer W with flash lamps FL ends to calculate a front surface temperature integrated value FS. Likewise, the integration part 31 integrates back surface temperatures of the semiconductor wafer W measured by a radiation thermometer 120 during the period from the time t2 to the time t3 to calculate a back surface temperature integrated value BS.

In the second preferred embodiment, when one of the formulas (1) and (2) is satisfied, a cracking determination part 32 determines that the semiconductor wafer W is not cracked. In other words, when both the formulas (1) and (2) are not satisfied, the cracking determination part 32 determines that the semiconductor wafer W is cracked. That is, the cracking determination part 32 determines that the semiconductor wafer W is cracked when the front surface temperature integrated value FS deviates from the preset range between the upper limit value FU and the lower limit value FL and when the back surface temperature integrated value BS deviates from the preset range between the upper limit value BU and the lower limit value BL.

In the second preferred embodiment, when the cracking determination part 32 determines that the semiconductor wafer W is not cracked, a chamber 6 is subjected to atmosphere replacement after a time t4 when preheating of the semiconductor wafer W with halogen lamps HL ends. Specifically, an atmosphere of a reactive gas is exhausted from the interior of the chamber 6 so that the interior the chamber 6 is decompressed to a pressure less than atmospheric pressure. Thereafter, a nitrogen gas is supplied into the chamber 6. The atmosphere replacement is thus achieved. After the atmosphere replacement in the chamber 6, the semiconductor wafer W is subjected to a cooling treatment, and is transported out of the chamber 6.

On the other hand, when the cracking determination part 32 determines that the semiconductor wafer W is cracked, a controller 3 suspends the processes in the heat treatment apparatus 1. In the case where the processes are suspended based on the determination that the semiconductor wafer W is cracked, the atmosphere replacement is not achieved, and the supply and exhaust of the gas into and from the chamber 6 are also stopped. In addition, the operation of the transport system for transporting the semiconductor wafer W into and out of the chamber 6 is also stopped. Further, the controller 3 may give a warning about the occurrence of wafer cracking to a display part 33. Thus, the fragments of the cracked semiconductor wafer W and the particles generated due to the cracking are confined in the chamber 6 as an enclosed space.

In the second preferred embodiment, the front surface temperatures and back surface temperatures of the semiconductor wafer W measured during the period from the time t2 when the flash irradiation starts to the time t3 when the flash heating of the semiconductor wafer W with the flash lamps FL ends are respectively integrated to calculate the front surface temperature integrated value FS and the back surface temperature integrated value BS. Then, the cracking determination part 32 determines whether the semiconductor wafer W is cracked at the time of flash irradiation, based on the front surface temperature integrated value FS and the back surface temperature integrated value BS. Accordingly, the determination as to whether the semiconductor wafer W is cracked is made before the atmosphere replacement starts after the time t4. Thus, in the case where the semiconductor wafer W is cracked at the time of flash irradiation, the wafer cracking is detected before the atmosphere replacement starts, and the processes are suspended before the atmosphere replacement, so that the atmosphere replacement is not achieved. This results in prevention of a failure of a vacuum pump in an exhaust part 190 caused when particles generated from a cracked semiconductor wafer W are carried into the vacuum pump. It should be noted that it is impossible to open the chamber 6 and clean up the interior of the chamber 6 while keeping the interior of the chamber 6 at the atmosphere of the reactive gas such as ammonia; therefore, the atmosphere replacement may be achieved in such a manner that the reactive gas is exhausted from the chamber 6 at the minimum exhaust flow rate, and then the nitrogen gas is supplied into the chamber 6.

As in the first preferred embodiment, the temperatures of the semiconductor wafer W are measured with such a simple configuration that the heat treatment apparatus 1 is provided with the radiation thermometers 120 and 140, and the cracking of the semiconductor wafer W is detected in such a manner that the measured temperatures are subjected to a simple computation process. Thus, the heat treatment apparatus 1 is capable of rapidly detecting cracking of a semiconductor wafer W at the time of flash irradiation with a simple configuration.

<Modifications>

While the preferred embodiments according to the present invention have been described hereinabove, various modifications of the present invention in addition to those described above may be made without departing from the scope and spirit of the invention. In the first preferred embodiment, it is determined that the semiconductor wafer W is cracked when the front surface temperature integrated value FS or the back surface temperature integrated value BS deviates from the corresponding range between the upper limit value and the lower limit value (i.e., OR determination on the front surface temperature integrated value FS and the back surface temperature integrated value BS). In the second preferred embodiment, it is determined that the semiconductor wafer W is cracked when the front surface temperature integrated value FS and the back surface temperature integrated value BS respectively deviate from the corresponding ranges between the upper limit values and the lower limit values (i.e., AND determination on the front surface temperature integrated value FS and the back surface temperature integrated value BS). Instead of these schemes, for example, the determination as to whether the semiconductor wafer W is cracked may be made based on only the front surface temperature integrated value FS. Alternatively, the determination as to whether the semiconductor wafer W is cracked may be made based on only the back surface temperature integrated value BS.

Alternatively, a determination as to whether a semiconductor wafer W is cracked at the time of flash irradiation may be made based on a temperature integrated value obtained by integrating temperatures of the susceptor 74 measured by the radiation thermometer 130. Alternatively, a determination as to whether a semiconductor wafer W is cracked may be made based on a temperature integrated value obtained by integrating atmospheric temperatures in the chamber 6 measured by the temperature sensor 150. When a semiconductor wafer W is cracked at a time of flash irradiation, a temperature of the susceptor 74 and an atmospheric temperature in the chamber 6 also behave abnormally due to the influence of the cracking. It is therefore possible to make a cracking determination based on temperature integrated values of the temperatures. In short, the determination as to whether the semiconductor wafer W is cracked may be made based on a temperature integrated value obtained by integrating temperatures of a component exhibiting an abnormal change in temperature different from a normal change when a semiconductor wafer W is cracked at the time of flash irradiation.

In the aforementioned preferred embodiments, the determination as to whether the semiconductor wafer W is cracked is made based on the temperature integrated value obtained by integrating the temperatures of the semiconductor wafer W measured during the period from the time when the flash irradiation starts to the time when the heating of the semiconductor wafer W ends. The present invention, however, is not limited to this. For example, the determination as to whether the semiconductor wafer W is cracked may be made based on whether an average value or a standard deviation of the temperatures of the semiconductor wafer W measured during the aforementioned period deviates from a predetermined range or not.

When cracking of a semiconductor wafer W is detected at the heat treatment apparatus 1, cracking of a semiconductor wafer W may occur at another heat treatment apparatus in which a semiconductor wafer W is treated in accordance with the same treatment recipe. For this reason, when cracking of a semiconductor wafer W is detected at the heat treatment apparatus 1, processes in another heat treatment apparatus in which a semiconductor wafer W is treated in accordance with the same treatment recipe may be stopped.

Although the 30 flash lamps FL are provided in the flash heating part 5 according to the aforementioned preferred embodiments, the present invention is not limited to this. Any number of flash lamps FL may be provided. The flash lamps FL are not limited to the xenon flash lamps, but may be krypton flash lamps. Also, the number of halogen lamps HL provided in the halogen heating part 4 is not limited to 40. Any number of halogen lamps HL may be provided.

In the aforementioned preferred embodiments, the filament-type halogen lamps HL are used as continuous lighting lamps that emit light continuously for not less than one second to preheat a semiconductor wafer W. The present invention, however, is not limited to this. In place of the halogen lamps HL, discharge type arc lamps (e.g., xenon arc lamps) may be used as the continuous lighting lamps for preheating.

Moreover, a substrate to be treated by the heat treatment apparatus 1 is not limited to a semiconductor wafer, but may be a glass substrate for use in a flat panel display for a liquid crystal display apparatus and the like, and a substrate for a solar cell. Also, the technique according to the present invention may be applied to the heat treatment of high dielectric constant gate insulator films (high-k films), to the joining of metal and silicon, and to the crystallization of polysilicon.

While the invention has been shown and described in detail, the foregoing description is in all aspects illustrative and not restrictive. It is therefore understood that numerous modifications and variations can be devised without departing from the scope of the invention.

What is claimed is:

1. A heat treatment method for heating a substrate by irradiating the substrate with a flash of light, comprising the steps of:
   (a) receiving a substrate in a chamber;
   (b) irradiating said substrate with light emitted from a continuous lighting lamp to heat said substrate to a preheating temperature;
   (c) irradiating a front surface of said substrate with a flash of light emitted from a flash lamp to heat the front surface;
   (d) measuring temperatures of said substrate during a period from a start of said flash irradiation to an end of the heating of said substrate;
   (e) integrating the temperatures of said substrate measured in said step (d) to calculate a temperature integrated value; and
   (f) determining that said substrate is cracked when said temperature integrated value deviates from a preset range between an upper limit value and a lower limit value, wherein:
   said step (d) includes measuring front surface temperatures and back surface temperatures of said substrate;
   said step (e) includes integrating the front surface temperatures of said substrate and the back surface temperatures of said substrate; and
   said step (f) includes determining that said substrate is cracked when a front surface temperature integrated value obtained by integrating the front surface temperatures of said substrate deviates from a preset range between an upper limit value and a lower limit value or a back surface temperature integrated value obtained by integrating the back surface temperatures of said substrate deviates from a preset range between an upper limit value and a lower limit value.

2. The heat treatment method according to claim 1, wherein
   said step (d) includes measuring temperatures of said substrate during a period from the start of said flash irradiation to an end of the heating of said substrate with said continuous lighting lamp.

3. The heat treatment method according to claim 1, wherein
   when it is determined in said step (f) that said substrate is cracked, supply and exhaust of gas into and out of said chamber are stopped.

4. A heat treatment method for heating a substrate by irradiating the substrate with a flash of light, comprising the steps of:
   (a) receiving a substrate in a chamber;
   (b) irradiating said substrate with light emitted from a continuous lighting lamp to heat said substrate to a preheating temperature;
   (c) irradiating a front surface of said substrate with a flash of light emitted from a flash lamp to heat the front surface;
   (d) measuring temperatures of said substrate during a period from a start of said flash irradiation to an end of the heating of said substrate;
   (e) integrating the temperatures of said substrate measured in said step (d) to calculate a temperature integrated value; and
   (f) determining that said substrate is cracked when said temperature integrated value deviates from a preset range between an upper limit value and a lower limit value, wherein:
   said step (d) includes measuring front surface temperatures and back surface temperatures of said substrate;
   said step (e) includes integrating the front surface temperatures of said substrate and the back surface temperatures of said substrate; and said step (f) includes determining that said substrate is cracked when a front surface temperature integrated value obtained by integrating the front surface temperatures of said substrate deviates from a preset range between an upper limit value and a lower limit value and a back surface temperature integrated value obtained by integrating the back surface temperatures of said substrate deviates from a preset range between an upper limit value and a lower limit value.

5. The heat treatment method according to claim 4 wherein
said step (d) includes measuring temperatures of said substrate during a period from the start of said flash irradiation to an end of the heating of said substrate with said flash lamp.

6. The heat treatment method according to claim 4, wherein
when it is determined in said step (f) that said substrate is cracked, supply and exhaust of gas into and out of said chamber are stopped.

* * * * *